US010330871B2

(12) United States Patent
Mizrahi et al.

(10) Patent No.: US 10,330,871 B2
(45) Date of Patent: Jun. 25, 2019

(54) INTEGRATED WAVEGUIDE COUPLER

(71) Applicant: Skorpios Technologies, Inc., Albuquerque, NM (US)

(72) Inventors: Amit Mizrahi, San Francisco, CA (US); Timothy Creazzo, Albuquerque, NM (US); Elton Marchena, Albuquerque, NM (US); Derek Van Orden, Albuquerque, NM (US); Stephen B. Krasulick, Albuquerque, NM (US)

(73) Assignee: Skorpios Technologies, Inc., Albuquerque, NM (US)

( * ) Notice: Subject to any disclaimer, the term of this patent is extended or adjusted under 35 U.S.C. 154(b) by 0 days.

(21) Appl. No.: 14/996,001

(22) Filed: Jan. 14, 2016

(65) Prior Publication Data

US 2016/0246016 A1   Aug. 25, 2016

Related U.S. Application Data

(63) Continuation of application No. 14/755,545, filed on Jun. 30, 2015, now Pat. No. 9,268,088, which is a
(Continued)

(51) Int. Cl.
*G02B 6/42* (2006.01)
*G02B 6/28* (2006.01)
(Continued)

(52) U.S. Cl.
CPC .......... *G02B 6/4206* (2013.01); *G02B 6/122* (2013.01); *G02B 6/14* (2013.01); *G02B 6/26* (2013.01);
(Continued)

(58) Field of Classification Search
CPC . G02B 6/26; G02B 6/14; G02B 6/262; G02B 6/1228; G02B 2006/12147; G02B 6/122; G02B 6/2804; G02B 6/2821
(Continued)

(56) References Cited

U.S. PATENT DOCUMENTS 4,182,545 A    1/1980 Greer
6,690,857 B2   2/2004 Zhoao et al.
(Continued)

FOREIGN PATENT DOCUMENTS

EP   0696747 A2   2/1996
EP   2141525 A1   10/2008
(Continued)

OTHER PUBLICATIONS

Barkai, A., et al., "Efficient Mode Converter for Coupling between Fiber and Micrometer Size Silicon Waveguides." *2007 4th IEEE International Conference on Group IV Photonics* (2007): pp. 49-51.
(Continued)

*Primary Examiner* — Kaveh C Kianni
*Assistant Examiner* — Hung Q Lam
(74) *Attorney, Agent, or Firm* — Kilpatrick Townsend & Stockton LLP

(57) ABSTRACT

A waveguide coupler includes a first waveguide and a second waveguide. The waveguide coupler also includes a connecting waveguide disposed between the first waveguide and the second waveguide. The connecting waveguide includes a first material having a first index of refraction and a second material having a second index of refraction higher than the first index of refraction.

11 Claims, 9 Drawing Sheets

Waveguide Coupler

Related U.S. Application Data continuation of application No. 13/597,117, filed on Aug. 28, 2012, now Pat. No. 9,097,846.

(60) Provisional application No. 61/528,938, filed on Aug. 30, 2011.

(51) Int. Cl.
| | |
|---|---|
| *G02B 6/122* | (2006.01) |
| *G02B 6/14* | (2006.01) |
| *G02B 6/26* | (2006.01) |
| *H01S 5/026* | (2006.01) |
| *H01S 5/30* | (2006.01) |
| *G02B 6/12* | (2006.01) |

(52) U.S. Cl.
CPC ............ *G02B 6/2804* (2013.01); *H01S 5/026* (2013.01); *H01S 5/3013* (2013.01); *G02B 2006/12097* (2013.01); *G02B 2006/12147* (2013.01)

(58) Field of Classification Search
USPC ................... 385/28, 30, 42–45, 50, 129–132
See application file for complete search history.

(56) References Cited

U.S. PATENT DOCUMENTS

| | | | |
|---|---|---|---|
| 6,931,178 | B2 | 8/2005 | Saccomanno |
| 7,359,593 | B2 | 4/2008 | Little |
| 7,701,985 | B2 | 4/2010 | Webster et al. |
| 8,222,084 | B2 | 7/2012 | Dallesasse et al. |
| 8,254,735 | B2 | 8/2012 | Tsai |
| 2004/0017962 | A1 | 1/2004 | Lee et al. |
| 2004/0077135 | A1 | 4/2004 | Fan et al. |
| 2004/0182914 | A1 | 9/2004 | Venugopalan |
| 2004/0245425 | A1 | 12/2004 | Delpiano et al. |
| 2004/0264840 | A1 | 12/2004 | Mule et al. |
| 2005/0058416 | A1 | 3/2005 | Hoon Lee et al. |
| 2005/0117844 | A1 | 6/2005 | Abeles et al. |
| 2006/0002443 | A1 | 1/2006 | Farber et al. |
| 2006/0093002 | A1 | 5/2006 | Park et al. |
| 2006/0104322 | A1 | 5/2006 | Park et al. |
| 2007/0172189 | A1* | 7/2007 | Koehl ........................ H01S 5/50 385/131 |
| 2008/0266639 | A1 | 10/2008 | Melloni et al. |
| 2009/0310140 | A1 | 12/2009 | Smith et al. |
| 2010/0040327 | A1* | 2/2010 | Deki ........................ G02B 6/305 385/28 |
| 2010/0111128 | A1 | 5/2010 | Qin et al. |
| 2010/0247031 | A1* | 9/2010 | Hayakawa ....... B29D 11/00663 385/14 |
| 2010/0247037 | A1 | 9/2010 | Little |
| 2011/0085760 | A1 | 4/2011 | Han et al. |
| 2011/0158584 | A1 | 6/2011 | Popovic |
| 2011/0216997 | A1 | 9/2011 | Gothoskar et al. |

FOREIGN PATENT DOCUMENTS

| | | |
|---|---|---|
| JP | 2005-508014 A | 3/2005 |
| JP | 2006-524843 A | 11/2006 |
| JP | 2008-147209 A | 6/2008 |
| JP | 2011-033963 A | 2/2011 |

OTHER PUBLICATIONS

Khilo, A., et al., "Efficient Planar Fiber-to-Chip Coupler Based on Two-Stage Adiabatic Evolution." *Optics Express* 18.15 (2010): pp. 15790-15806.

Park, H., et al., "A Fiber-to-Chip Coupler Based on Si/SiON Cascaded Tapers for Si Photonic Chips." *Optics Express* 21.24 (2013): pp. 29313-29319.

ISR/WO dated Jan. 22, 2015 for International Patent Application No. PCT/US2014/059900 filed on Oct. 9, 2014, all pages.

Notification of Transmittal of the International Search Report And The Written Opinion Of The International Searching Authority, Or The Declaration; International Search Report and Written Opinion Of The International Searching Authority for corresponding International Application No. PCT/US2012/052913 dated Nov. 16, 2012, 14 pages.

European Supplemental Search Report dated Apr. 9, 2015 for International Patent Application No. 12827040.2-1553 filed on Aug. 29, 2012, all pages.

Office Action dated Jul. 26, 2016 for Japanese Patent Application No. 2014-528559, filed Aug. 29, 2012; all pages.

EP 12827040.2 filed Aug. 29, 2012, received an Office Action dated Apr. 9, 2018, 4 pages.

English translation of Office Action dated Jul. 26, 2017 for Japanese Patent Application No. 2014-528559; all pages.

JP2014-528559 received a Notice of Allowance, dated May 29, 2018, 3 pages.

KR10-2014-7007894 received an Office Action, dated Jun. 8, 2018, 8 pages.

Notice of Decision to Grant for Korean Patent Application No. 10-2014-7007894 dated Mar. 21, 2019, 5 pages.

Second Office Action for European Patent Application No. 12827040.2 dated Mar. 26, 2019, 4 pages.

* cited by examiner

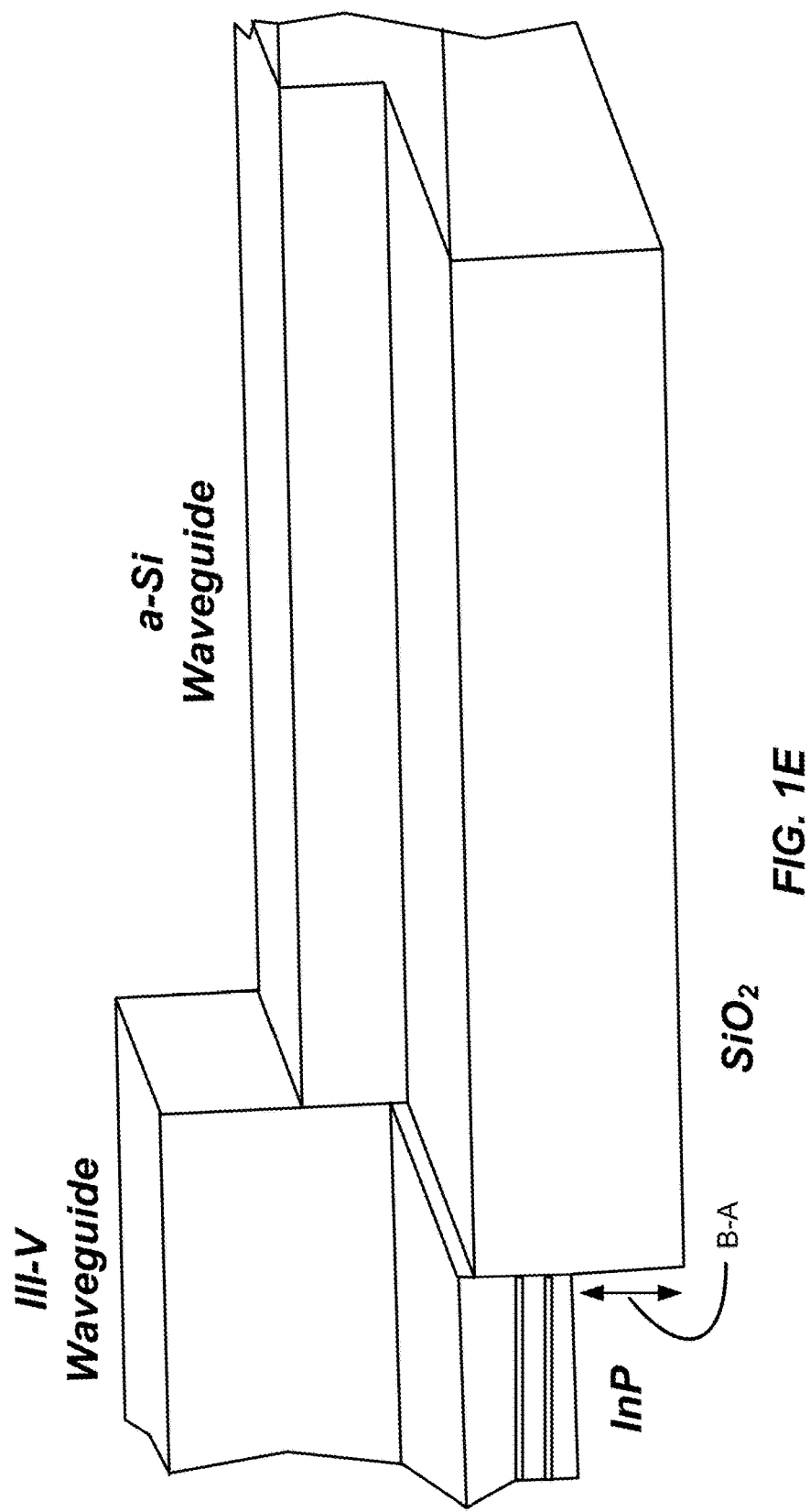

III/V Waveguide a - Si Bridge and SOI

INTEGRATED WAVEGUIDE COUPLER

CROSS-REFERENCES TO RELATED APPLICATIONS

This application is a continuation of U.S. application Ser. No. 14/755,545, filed on Jun. 30, 2015, entitled "Integrated Waveguide Coupler", which application is a continuation of U.S. application Ser. No. 13/597,117, filed on Aug. 28, 2012, entitled "Integrated Waveguide Coupler," now U.S. Pat. No. 9,097,846, issued Aug. 4, 2015, which application claims priority to U.S. Provisional Patent Application No. 61/528,938, filed on Aug. 30, 2011, entitled "Integrated Waveguide Coupler," the disclosures of which are hereby incorporated by reference in their entirety for all purposes.

BACKGROUND OF THE INVENTION

Advanced electronic functions such as photonic device bias control, modulation, amplification, data serialization and de-serialization, framing, routing, and other functions are typically deployed on silicon integrated circuits. A key reason for this is the presence of a global infrastructure for the design and fabrication of silicon integrated circuits that enables the production of devices having very advanced functions and performance at market-enabling costs. Silicon has not been useful for light emission or optical amplification due to its indirect energy bandgap. This deficiency has prevented the fabrication of monolithically integrated optoelectronic integrated circuits on silicon.

Compound semiconductors such as indium phosphide, gallium arsenide, and related ternary and quaternary materials have been extremely important for optical communications, and in particular light emitting devices and photodiodes because of their direct energy bandgap. At the same time, integration of advanced electrical functions on these materials has been limited to niche, high-performance applications due to the much higher cost of fabricating devices and circuits in these materials.

Thus, there is a need in the art for improved methods and systems related to composite integration of silicon and compound semiconductor devices.

SUMMARY OF THE INVENTION

Embodiments of the present invention relate to methods and systems for coupling of optical radiation in optoelectronic devices. More particularly, embodiments of the present invention relate to methods and apparatus for waveguide couplers in composite integrated devices including silicon and compound semiconductor devices. Embodiments of the present invention have wider applicability than this example and also include use in other opto-electronic devices including other substrates, non-linear optical materials, polarization-based devices, and the like.

BRIEF DESCRIPTION OF THE DRAWINGS

FIG. 1E is a simplified perspective view of the integrated waveguide coupler illustrated in FIG. 1C;

DETAILED DESCRIPTION OF THE INVENTION

Embodiments of the present invention relate to methods and systems for integrated waveguide couplers. In an embodiment, a connecting waveguide between two waveguides is provided in order to optically couple two materials using an on-chip waveguide. As an example, optical coupling between a silicon on insulator waveguide and a compound semiconductor material (e.g., a III-V opto-electronic device) can be performed using embodiments of the present invention. In another embodiment of the invention, optical coupling between a silicon on insulator (SOI) waveguide and an optical fiber is performed using the methods and systems described herein.

The inventors have determined that integrated devices made of two or more material systems are challenging to implement because of challenges related to coupling of light into and out of the devices. Examples of such integrated devices include devices having a III/V die integrated (e.g., grown or bonded) on top of an SOI substrate. Integrated devices have wide applicability and include devices such as lasers, modulators, detectors, and the like.

Embodiments of the present invention provide solutions to integration issues by, as an example, providing a bridge waveguide coupler that is effective to efficiently guide the light between the host material system (e.g., an SOI substrate or waveguide) and the integrated material (e.g., a III/V optically active device integrated with the host material system).

The bridge waveguide couplers described herein are suitable for applications in which there is an inherent gap between the integrated material and the host material. As an example, devices that include a process for bonding of a III/V die onto a silicon-based substrate.

According to embodiments of the present invention, integrated waveguide couplers are provided in which the waveguide is integrated into a semiconductor substrate, for example, an SOI substrate, a III-V substrate, or the like.

Figure 1A:
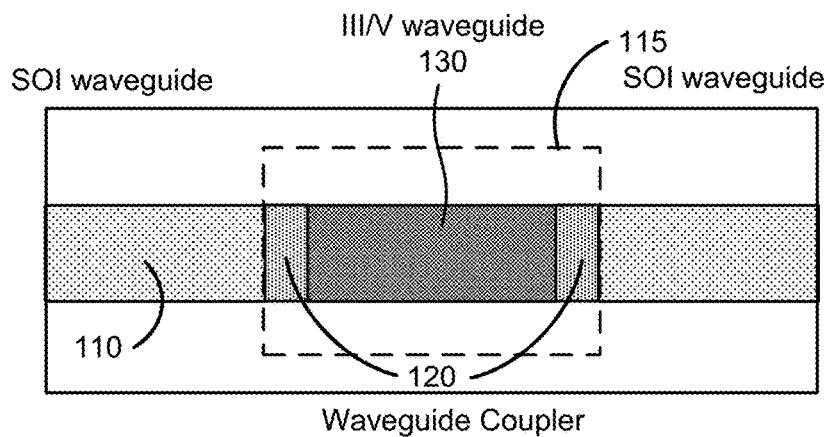
FIG. 1A is a simplified plan view of an integrated waveguide coupler according to an embodiment of the present invention.

FIG. 1A is a simplified plan view of an integrated waveguide coupler according to an embodiment of the present invention. As illustrated in FIG. 1A, an SOI waveguide region 110 is provided that includes a silicon-based waveguide inside a silicon oxide region. A waveguide coupler region 120 (also referred to as a connecting waveguide) joins SOI waveguide regions 110 to a III-V waveguide region 130. In some implementations, the III-V waveguide region 130 includes optically active materials that can produce optical gain, variable optical phase, optical attenuation, absorption, or the like. In other implementations, the III-V waveguide region 130 includes materials that operate as a detector, generating an electrical current in response to optical input. The bonding region 115 for bonding of the III-V waveguide structure 130 to the substrate is also illustrated. One of ordinary skill in the art would recognize many variations, modifications, and alternatives.

Figure 1B:
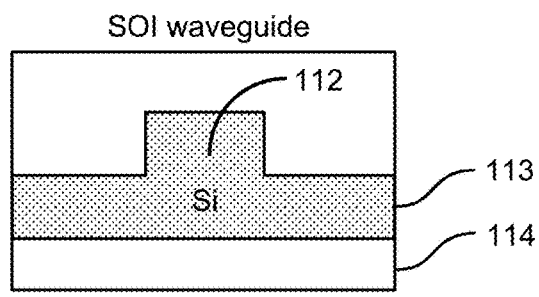
FIG. 1B is a simplified cross-sectional view of a first region of the integrated waveguide coupler illustrated in FIG. 1A.

FIG. 1B is a simplified cross-sectional view of a first region, the SOI waveguide region 110, of the integrated waveguide coupler illustrated in FIG. 1A. As illustrated in FIG. 1B, a lateral optical confinement structure 112, for example, a silicon-based material having a relatively higher refractive index (i.e., a ridge guide structure), is surrounded on one or more sides by a material having a lower refractive index, such as a silicon oxide. Thus, in some embodiments, the cladding is a silicon oxide (e.g., $SiO_2$) material. In some implementations, the silicon-based material includes a single crystal silicon layer 113 joined to an oxide layer 114 formed through an oxide growth process, a deposition process, a bonding process, or the like. The lateral optical confinement structure 112 can be fabricated by removing a portion of the single crystal silicon layer 113, for example, using an etching process, to form the ridge extending in the transverse direction and defined by a lateral width as illustrated. Subsequent oxide deposition can then be performed. In another embodiment, the ridge portion could be masked and areas outside the ridge can be oxidized, the masking material can be removed, and an additional oxide deposition process can be used to complete the formation of the structure. The use of SOI materials provides the ability to integrate optical structures, such as the optically active materials described herein, with CMOS compatible structures, enabling the integration of electronic devices with optical devices. One of ordinary skill in the art would recognize many variations, modifications, and alternatives.

Figure 1C:
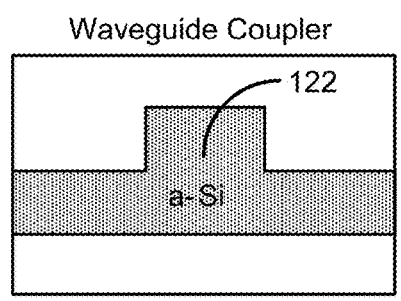
FIG. 1C is a simplified cross-sectional view of a second region of the integrated waveguide coupler illustrated in FIG. 1A.
Figure 1D:
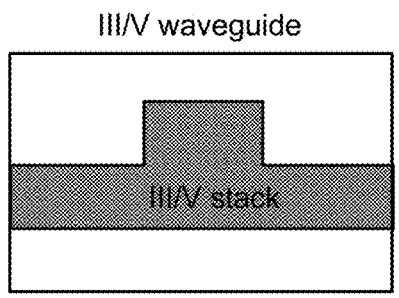
FIG. 1D is a simplified cross-sectional view of a third region of the integrated waveguide coupler illustrated in FIG. 1A.

FIG. 1C is a simplified cross-sectional view of a second region, the waveguide coupler region 120, of the integrated waveguide coupler illustrated in FIG. 1A. In the embodiment illustrated in FIG. 1C, the waveguide coupler region 120 includes a high index amorphous silicon (a-Si) portion surrounded by lower index materials, for example, silicon oxide. FIG. 1D is a simplified cross-sectional view of a third region, the III-V waveguide region 130, of the integrated waveguide coupler illustrated in FIG. 1A. As described herein, the waveguide coupler 120 provides a mechanism for coupling light from the first material system associated with the SOI waveguide region and the second, different material system associated with the III-V waveguide region.

Referring once again to FIG. 1C, the waveguide coupler 120 provides optical coupling between the SOI waveguide region 110 and the III-V waveguide region 130. In an embodiment, the longitudinal dimension of the waveguide coupler 120 ranges from about 1 μm to about 100 μm, for example, 5 μm, but there is no actual limit on the length of the coupler. The width of the lateral optical confinement structure 122 is determined in view of the width of the lateral optical confinement structure 112. In the illustrated embodiment, the lateral widths of 112 and 122 are equal although this is not required by the present invention. In fact, the three waveguide sections 110, 120-, and 130, may have different cross-sectional dimensions to optimize transmission. Moreover, the vertical alignment of the three waveguide sections 110, 120, and 130 may differ depending on the refractive indices of the III/V waveguide section in comparison with the other waveguide sections.

Figure 2:
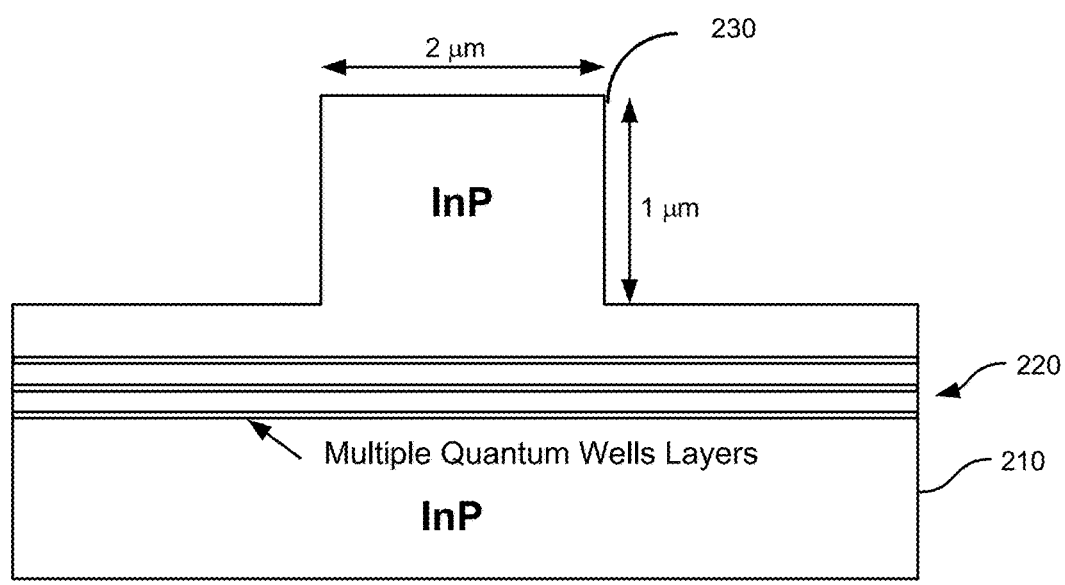
FIG. 2 is a simplified cross-sectional view of an optically active III-V waveguide region according to an embodiment of the present invention.

FIG. 1E is a simplified perspective view of the integrated waveguide coupler illustrated in FIG. 1C. The perspective view illustrates the III-V waveguide region and the waveguide coupler region. The III-V waveguide region includes a III-V ridge waveguide extending to a predetermined height above the InP substrate. The multiple quantum well structure illustrated in FIG. 2 is also shown. The waveguide coupler region includes a a-Si ridge waveguide structure above a layer of an oxide/nitride material or other suitable low index material (not shown). In some embodiments, the offset (line B minus line A (i.e., B-A), discussed in additional detail with respect to FIGS. 5A and 5B) is selected to provide for a high coupling coefficient between the III-V waveguide region and the waveguide coupler region. In the illustrated embodiment, the offset is 530 nm and can take on different values depending on the epitaxial structure of the III-V waveguide region and the thicknesses and indices of the materials in the waveguide coupler region. One of ordinary skill in the art would recognize many variations, modifications, and alternatives.

FIG. 2 is a simplified cross-sectional view of an optically active III-V waveguide region according to an embodiment of the present invention. The structure illustrated in FIG. 2 is suitable for use as the III-V waveguide region 130 illustrated in FIG. 1D. As illustrated in FIG. 2, the optically active III-V waveguide region includes a substrate layer 210, e.g., InP, GaAs, InGaAs, InGaAsP, AlGaInAs, GaN, or other suitable materials. An active region 220 is provided to provide optical gain, enabling laser or amplifier operation. In the illustrated embodiment, the active region 220 includes a plurality of quantum well layers disposed between barrier layers. Although not illustrated in FIG. 2 for purposes of clarity, optical mode control is provided in the transverse (vertical) direction. Additionally, a lateral mode control structure 230 is provided to provide optical confinement in the lateral (horizontal) direction. The particular dimensions of the lateral mode control structure 230 will depend on the particular application and the example dimensions of a 1 μm height and a 2 μm width illustrated in FIG. 2 are merely provided by way of example. Other dimensions suitable for use in providing optical mode control are included within the scope of the present invention.

Although the ridge waveguides illustrated in FIGS. 1B-1D are fabricated using a single material in each section, other embodiments can include differing materials in each section as discussed in relation to the process flow illustrated in FIGS. 7A-7F. Thus, the SOI waveguide section can include a silicon substrate, a dielectric layer (e.g., SiO₂), a Si layer, and an amorphous silicon (i.e., a-Si) layer, providing differing indices as a function of height. Moreover, the waveguide coupler region can include a silicon substrate, a dielectric layer of a first height (e.g., SiO₂) and an a-Si layer of a second predetermined height in addition to the design using a-Si illustrated in FIG. 1C. The design of the various materials and thicknesses provides control of the optical waveguide properties, enabling mode control and achieving predetermined coupling efficiencies. In addition to a-Si, other high index materials such as silicon nitride, germanium, silicon-germanium, III-V materials, and the like can be utilized according to embodiments of the present invention.

Tapering of one or more of the waveguides may improve efficiency of the system, as shown in FIGS. 3A-3D. This is particularly desirable to reduce radiation losses due to lateral misalignment fabrication errors. In the embodiment illustrated in FIG. 3A, tapering of the waveguide in the SOI waveguide section enables for lateral extension of the waveguide coupler section and the III-V waveguide section, which is suitable for applications including lasers and modulators.

Figure 3A:
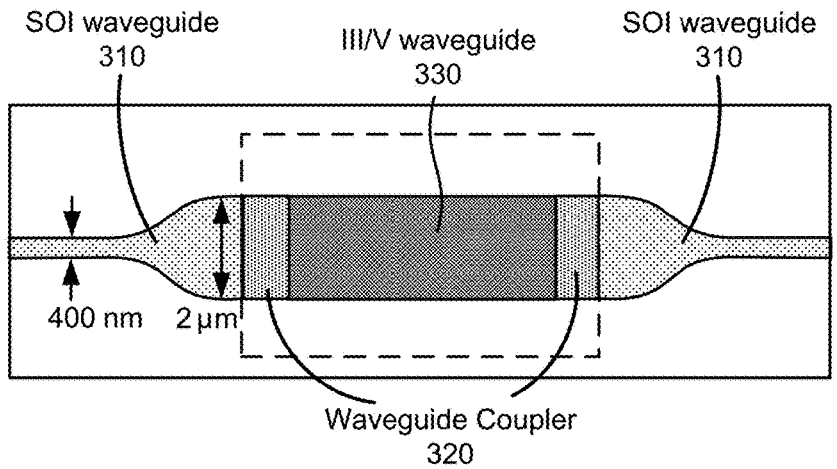
FIG. 3A is a simplified plan view of an integrated waveguide coupler according to an embodiment of the present invention.

FIGS. 1A and 3A provide a top view of the laterally patterned waveguides and the connecting waveguide according to non-tapered and tapered designs. In FIG. 3A, the SOI waveguide is tapered, but the waveguide coupler (i.e., the connecting waveguide) can be tapered as well to provide an effective index transition between waveguides with different effective indices. One of ordinary skill in the art would recognize many variations, modifications, and alternatives.

Additional description related to template assisted bonding and wafer-scale bonding of photonic devices to SOI wafers including CMOS devices is provided in U.S. patent application Ser. No. 13/112,142, the disclosure of which is hereby incorporated by reference in its entirety for all purposes.

Although the tapering is wholly performed in the SOI waveguide section in the implementation illustrated in FIG. 3A, the present invention is not limited to this particular implementation. On the contrary, the tapering can be present in more than one section, for example, wholly in the SOI waveguide section, partly in the SOI waveguide section, partly in the waveguide coupler section, partly in the III-V waveguide section, wholly in the waveguide coupler section, wholly in the III-V waveguide section, or combinations thereof. Thus, embodiments of the present invention are not limited to the tapered structure illustrated in FIG. 3A, but can include other tapering geometries. One of ordinary skill in the art would recognize many variations, modifications, and alternatives.

Figure 3B:
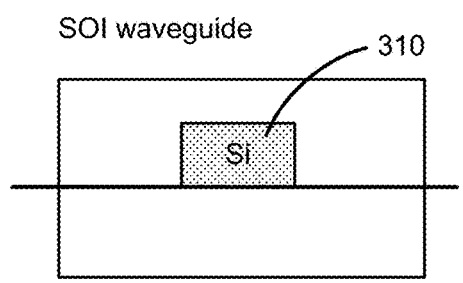
FIG. 3B is a simplified cross-sectional view of a first region of the integrated waveguide coupler illustrated in FIG. 3A.
Figure 3C:
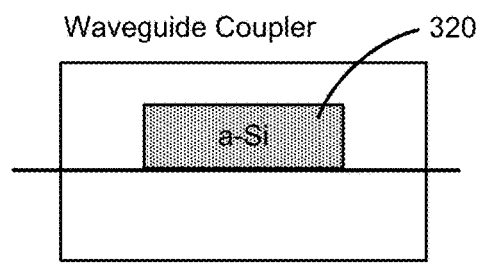
FIG. 3C is a simplified cross-sectional view of a second region of the integrated waveguide coupler illustrated in FIG. 3A.
Figure 3D:
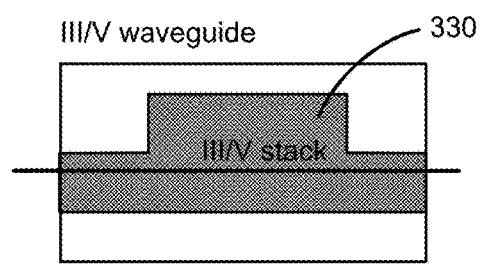
FIG. 3D is a simplified cross-sectional view of a third region of the integrated waveguide coupler illustrated in FIG. 3A.

FIG. 3B is a simplified cross-sectional view of a first region of the tapered integrated waveguide coupler illustrated in FIG. 3A. FIG. 3C is a simplified cross-sectional view of a second region of the tapered integrated waveguide coupler illustrated in FIG. 3A. FIG. 3D is a simplified cross-sectional view of a third region of the tapered integrated waveguide coupler illustrated in FIG. 3A. As illustrated in these cross-sectional views, the lateral extent of the various sections varies as a function of longitudinal position. In these embodiments, the waveguide coupler section connects a rectangular SOI waveguide and a III/V rib waveguide region, for example, as part of a laser cavity. In the illustrated embodiment, the SOI waveguide is tapered from 400 nm to 2 μm to better match the wider III/V waveguide section. Of course, other dimensions can be utilized to accommodate the optical modes and provide a high level of optical coupling between the waveguide sections. Thus, embodiments of the present invention provide waveguide couplers with cross-sections that are the same (e.g., rib or rectangular) or of different types (e.g., different cross-sections) as shown in the tapered design.

Figure 4:
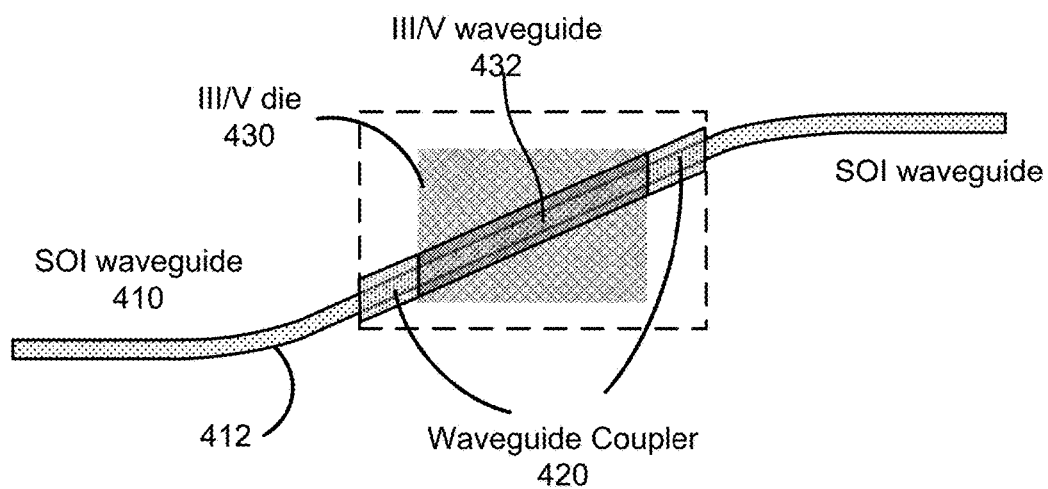
FIG. 4 is a simplified plan view of an integrated waveguide coupler according to an alternative embodiment of the present invention.

FIG. 4 is a simplified plan view of an integrated waveguide coupler according to an alternative embodiment of the present invention. In the alternative embodiment illustrated in FIG. 4, the bridge waveguide coupler section is utilized with a III-V waveguide section in a configuration with angled facets. The angled facets may prevent reflections from the interfaces back into the waveguides to obtain, for example, a high performance laser cavity. The cross-section of the waveguides may be one or several types including the various cross-sections described herein. As illustrated in FIG. 4, the SOI waveguide sections 410 include a curvature 412 in the lateral waveguide design to enable the light to propagate in a horizontal direction and then a direction tilted with respect to the horizontal, passing through the waveguide coupler section 420 in a direction tilted with respect to the horizontal, and entering the III-V waveguide section 432 formed in the III-V die 430 at an angle with respect to the facet of the III-V die.

Figure 5A:
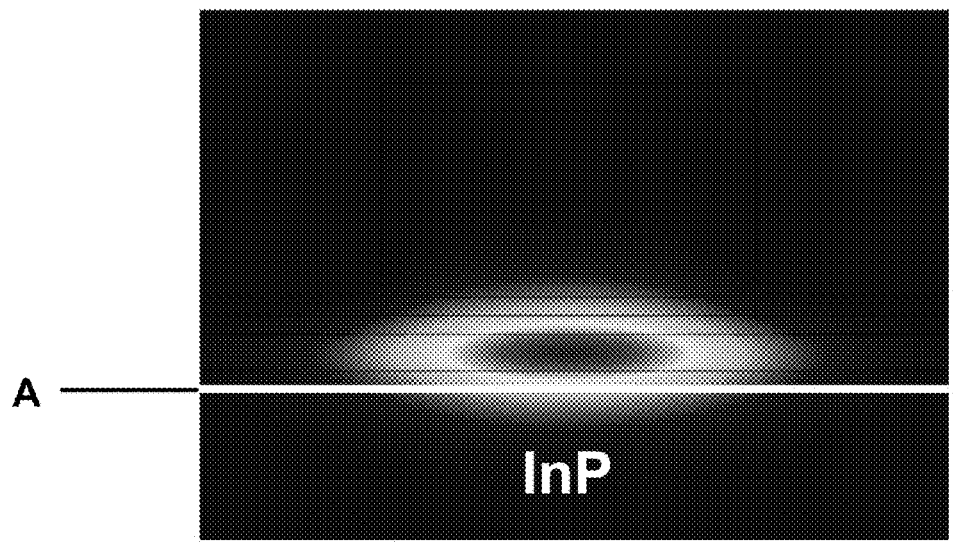
FIG. 5A is an illustration of the mode distribution in the III-V waveguide region according to an embodiment of the present invention.

FIG. 5A is an illustration of the mode distribution in the III-V waveguide region according to an embodiment of the present invention. An end view of the III-V waveguide region is provided, with the mode profile having a mode distribution with a peak amplitude in the epitaxial layers disposed above the interface (line A) between the InP substrate and the epitaxial layers. In the illustrated embodiment, the III-V waveguide region is formed on an InP substrate, but this is not required by the present invention. Depending on the epitaxial structure utilized for the III-V waveguide region, for example, a laser, a detector, a modulator, or the like, the vertical spacing between the peak amplitude of the mode distribution and line A will vary as will be evident to one of skill in the art. A single spatial mode is illustrated although higher order modes may be present in some designs.

Figure 5B:
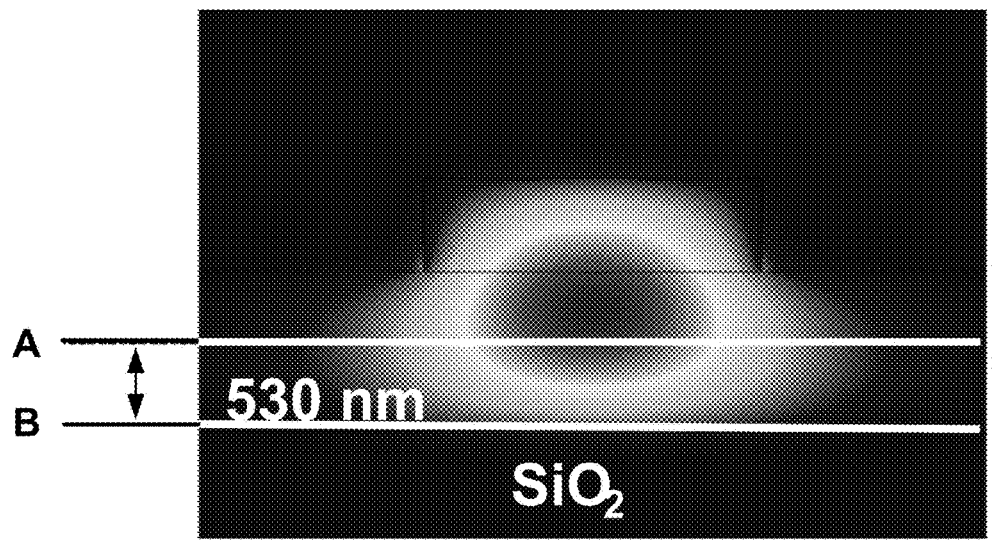
FIG. 5B is an illustration of the mode distribution in the SOI waveguide region and the waveguide coupler region according to an embodiment of the present invention.

FIG. 5B is an illustration of the mode distribution in the SOI waveguide region and the waveguide coupler region according to an embodiment of the present invention. The mode distribution shares some similarities with the mode distribution illustrated in FIG. 5A, for example, the single spatial mode. The transverse extent of the mode distribution in the SOI waveguide region and the waveguide coupler region is larger than that of the mode distribution in the III-V waveguide region and the peak amplitude of the mode is separated from the interface (line B) between the oxide layer and the silicon/amorphous silicon layer by a distance greater than the separation between the peak amplitude of the mode in the III-V waveguide region and the corresponding interface (line A). For these mode distributions, the separation between line A and line B is 530 nm although other separations can be utilized depending on the index profiles of the various regions. In other embodiments, the separation between line A and line B ranges from about 0 nm to about 1000 nm, assuming a wavelength ~1550 nm, but the separation could be higher as well. The design of the waveguide regions enables high (e.g., maximum) overlap between the mode distributions, particularly in the transverse and vertical directions. In the illustrated example, the lateral extent of the mode distributions is substantially equal.

Figure 6A:
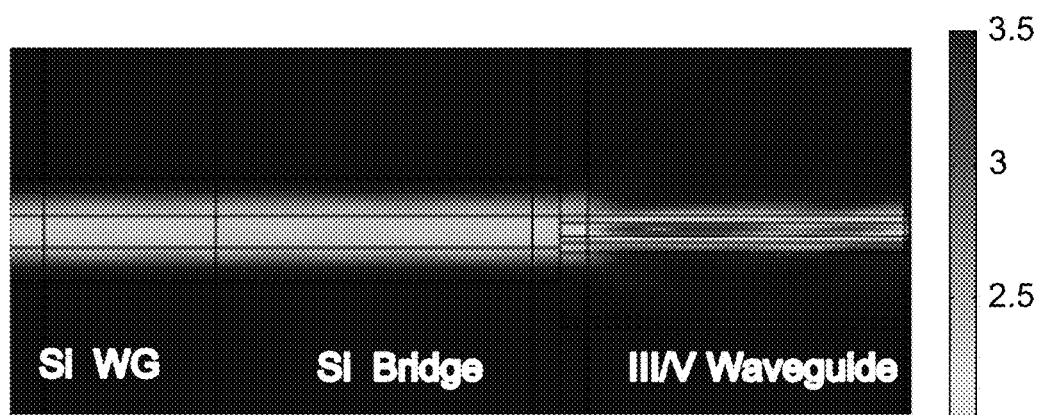
FIG. 6A is a side view illustrating optical intensity in the optical device according to an embodiment of the present invention.
Figure 6B:
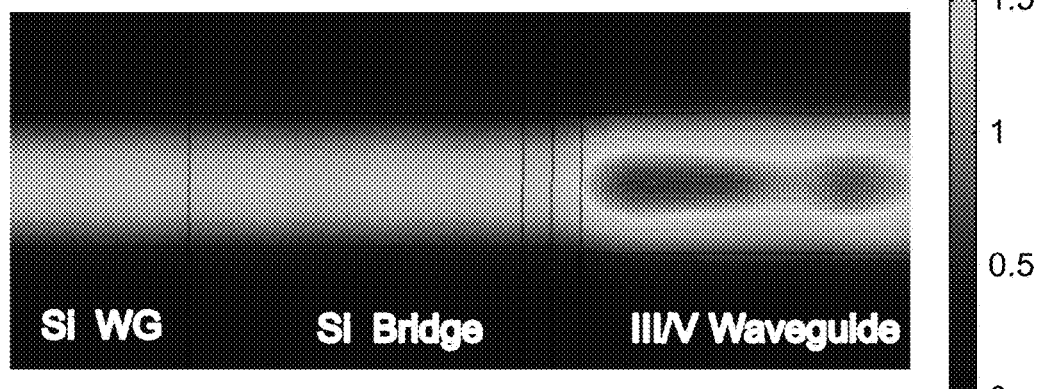
FIG. 6B is a plan view illustrating the optical intensity in the optical device according to an embodiment of the present invention.

FIG. 6A is a side view illustrating optical intensity in the optical device according to an embodiment of the present invention. FIG. 6B is a plan view illustrating the optical intensity in the optical device according to an embodiment of the present invention. As illustrated in these figures, light is launched from the silicon waveguide (a-Si waveguide or SOI waveguide) on the left portion of the figure. The optical mode in the silicon waveguide propagates into and through the Si Bridge (waveguide coupler) and into the III-V waveguide. As illustrated in these figures, the optical coupling between the SOI waveguide and the waveguide coupler is high, as well as the optical coupling between the waveguide coupler and the III-V waveguide.

Utilizing embodiments of the present invention, high levels of optical coupling are provided through the use of the waveguide coupler. As an example, a configuration in which a 5μm gap between the SOI waveguide and the III-V waveguide is filled with $SiO_2$ results in a power transmission of 20%, that is, only 20% of the optical power propagating in the SOI waveguide is coupled into the III-V waveguide after passing through the oxide filling the gap. In contrast, filling of the gap with an amorphous silicon ridge waveguide with $SiO_2$ cladding (illustrated in FIG. 1B with silicon ridge waveguide 113, oxide layer 114, and overlying oxide layer) results in a power transmission coefficient of 93%.

FIGS. 7A-7F are schematic process flow diagrams for the fabrication of an integrated waveguide coupler according to an embodiment of the present invention. As illustrated in FIGS. 7A-7F, a process flow for a specific embodiment of the bridge waveguide coupler is described. The waveguide coupler connects the SOI waveguide section and the III-V waveguide section. The gap 720, also referred to as a separation region between the SOI waveguide section 710 and the III-V waveguide section 730 is formed when the III-V waveguide section is bonded to the substrate (e.g., a silicon substrate) and can range from a few microns (e.g., 5 μm) to greater distances (e.g., 100 μm). As will be evident to one of skill in the art, when the III-V material is bonded to the Si substrate near the SOI waveguide, a region exists between the SOI waveguide and the III-V material that is filled according to embodiments of the present invention in order to provide for a high coupling efficiency between the SOI waveguide and the III-V material.

Figure 7A:
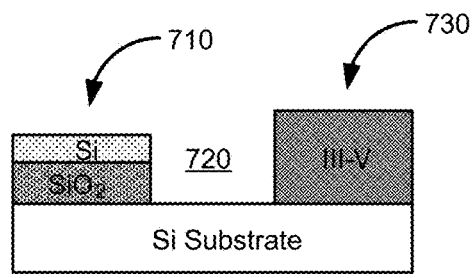
FIGS. 7A-7F are schematic process flow diagrams for the fabrication of an integrated waveguide coupler according to an embodiment of the present invention.

FIG. 7A illustrates the structure after bonding (or growth) of the III-V material, with the longitudinal separation between the SOI waveguide and the III-V material being a function of the device design, bonding (or growth) tolerances, and the like.

Figure 7D:
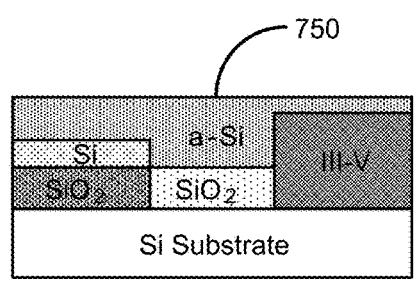
Figure 7B:
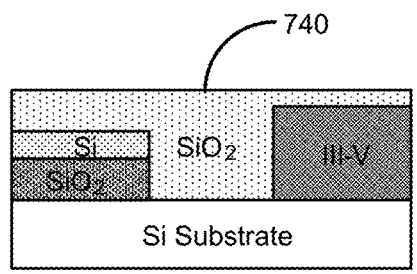

Referring to FIG. 7B, the first material for the waveguide coupler (e.g., $SiO_2$) 740 is deposited via one or more methods, including PECVD, CVD, sputtering, SACVD, combinations or the like. As illustrated, the deposited first material 740 fills the gap 720 between the SOI waveguide 710 and III-V waveguide section 730 as well as being deposited on both the SOI waveguide section and the III-V waveguide section. After deposition, the first material (e.g., $SiO_2$) can be planarized using CMP, etching, polishing, combinations thereof, or the like to provide a structure as shown in FIG. 7B. In other embodiments, other dielectric materials, including $Si_3N_4$ can be utilized to provide the first material for the waveguide coupling section. In addition to $SiO_2$ and $Si_3N_4$, other materials, including dielectric materials such as $Si_xO_y$, $Si_xO_yN_z$, $Si_xN_y$, combinations thereof, and the like can be utilized during the deposition process. Depending on the mode profile in the various waveguide regions, the thicknesses and indices of the materials in the waveguide coupler are selected to provide a high coupling coefficient between the SOI waveguide region and the III-V waveguide region.

Figure 7E:
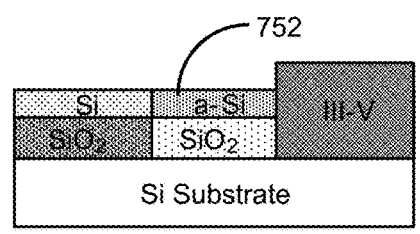
Figure 7C:
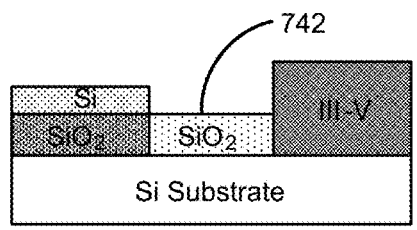

Referring to FIG. 7C, the material for the waveguide coupler is removed to provide a first material 742 in the gap between the SOI waveguide section and the III-V waveguide section, filling the waveguide coupler section to a predetermined height (for example, by etching the $SiO_2$ down to a height that matches the height of the $SiO_2$ in the SOI waveguide section). Although the $SiO_2$ layers are the same height in FIG. 7C, for example, several microns, for instance, 2-3 μm, this is not required by the present invention, although in some embodiments, the height of the top of the deposited/etched $SiO_2$ in the waveguide coupler section matches the height of the top of the $SiO_2$ in the SOI waveguide section to provide desired optical coupling coefficients. Thus, the thickness of the $SiO_2$ layers in both the SOI waveguide section and the waveguide coupler section are equal in some embodiments to provide for a high coupling coefficient (good impedance match) between these waveguide sections. Additionally, although the height of the bottom of the $SiO_2$ in the SOI waveguide section is aligned with the bottom of the $SiO_2$ in the waveguide coupler section, these portions do not need to match in some embodiments. Thus, the illustration provided in FIG. 7C is merely provided by way of example, showing one implementation in which the top and bottoms of these respective layers are aligned. As an example, the height of the $SiO_2$ layer in the waveguide section may be higher than the height of the $SiO_2$ layer in the SOI waveguide section if the III-V waveguide has a mode profile for which the center of the mode is higher than the center of the mode in the SOI waveguide section. During the removal process, portions of the structure may be masked as appropriate to the process flow.

FIG. 7D illustrates the deposition of a second material 750 for the waveguide coupler section, providing a differing index of refraction as a function of height. In the illustrated embodiment, a-Si is deposited via one or more methods including PECVD, CVD, sputtering, SACVD, combinations thereof, or the like. In the illustrated embodiment, the a-Si deposition fills the gap between the SOI waveguide section and the III-V waveguide section as well as depositing above both the SOI waveguide section and the III-V waveguide section. A planarization process is then used to planarize the a-Si using CMP, etching, polishing, combinations thereof, or the like.

In order to define the thickness of the second material for the waveguide coupler, the second material is removed (e.g., by etching) to reduce the thickness so that the height of the a-Si matches the height of the Si in the SOI waveguide section. In the embodiment illustrated in FIG. 7E, the a-Si layer 752 (i.e., the second material for the waveguide coupler) is matched in height (top and bottom) to the Si layer in the SOI waveguide section, providing a component of the impedance matching structure provided by the multilayer waveguide structure formed in the gap between the SOI waveguide region and the III-V waveguide region. In other embodiments, the heights of the layers do not have to match as shown in FIG. 7E. One of ordinary skill in the art would recognize many variations, modifications, and alternatives.

Figure 7F:
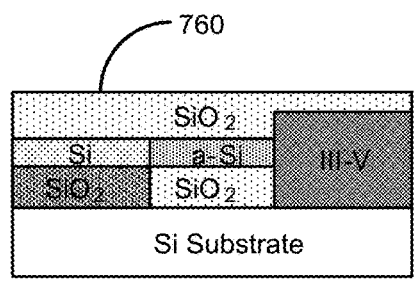

Referring to FIG. 7F, a waveguide pattern is etched into the a-Si to provide lateral confinement in the waveguide coupling region that matches the SOI and III-V waveguides (cannot be seen in this cross section). An $SiO_2$ layer 760 is deposited using PECVD, CVD, Sputtering, SACVD, or similar method to encapsulate the structure.

Although a planarizing deposition is illustrated in FIG. 7B, this is not required by embodiments of the present invention. In an alternative embodiment, a selective deposition process is utilized to form the waveguide coupler material (e.g., SiO$_2$) in the trench formed between the SOI waveguide section and the III-V waveguide section. In this alternative embodiment, the thickness of the waveguide coupler material after selective deposition, or after a subsequent etch, will be equal to that illustrated in FIG. 7C. Moreover, in this alternative embodiment, a second selective deposition could be utilized to form the upper portion of the waveguide coupler section as illustrated in FIG. 7E.

Referring once again to FIGS. 1A-1D, the top view and cross-sectional views of the structure show the two waveguide sections or regions and the gap between the waveguides, in which the waveguide coupler is formed. As described herein, the gap between the two waveguide regions is partially filled with an initial material (i.e., a low-index material) with an index of refraction that is lower than an index of refraction of a subsequently used material (i.e., a high-index material) as illustrated in FIG. 7C. Partial filling can include a deposition and etch back process. The gap is subsequently filled with a material with an index of refraction that is higher than the initial material as illustrated in FIG. 7E. In an embodiment of the present invention, the effective index of refraction associated with the waveguides can be substantially matched to the effective index of refraction associated with the materials formed in the gap, but this is not required by the present invention and the indices can differ. In other embodiments, the first and second waveguides are associated with different effective indices of refraction, for example, when the waveguides are fabricated using dissimilar materials such as silicon and III-V materials. As an example, the waveguide coupler, as well as the other waveguides, can include more complex index profiles, such as transverse high-low-high index waveguides, sometimes referred to as slot waveguides. Thus, embodiments of the present invention are described in terms of materials having an index of refraction and this should include composite or multi-layer materials that, together, are characterized by an index of refraction for the structure. As an example, although waveguide couplers are described in terms of a first material having a first index of refraction and a second material having a second index of refraction, both of the first and second material can actually be fabricated using multiple sub-layers of material, providing an effective or modal index for the stack of sub-layers. Thus, embodiments of the present invention are not limited to merely two layers of material, but the description should be understood to include multiple sub-layers in each of the first and second material layers. One of ordinary skill in the art would recognize many variations, modifications, and alternatives.

The low-index material prevents the optical modes from leaking into the substrate due to guiding in the high-index material in the gap. The waveguides are patterned to form waveguide structures (e.g., ridge waveguides or rib waveguides), with a lateral structure evident in the cross-sectional views illustrated in FIGS. 1B-1D. The waveguide patterning process can be performed prior to the fabrication of the waveguide coupler region, coincident with the fabrication of the waveguide coupler region, or after the fabrication of the waveguide coupler region. The waveguide coupler region can be tapered as discussed above to provide an effective index that transitions from a first value adjacent the first waveguide to a second value adjacent the second waveguide.

Referring to FIGS. 7A-7F, a particular implementation of the connecting waveguide fabrication process is illustrated. As illustrated in FIG. 7B, the gap between the two waveguides is filled with a low-index material, for example, silicon dioxide (SiO$_2$), silicon nitride (Si$_3$N$_4$), SOG, SiO$_x$, SiN$_x$, TiO$_2$, SiON, other dielectrics, or the like. A deposition process such as PECVD, LPCVD, sputtering, PVD, evaporation, atomic layer deposition, a spin-on process, or the like can be used. Additionally, spin-on-glass (SOG) can be used to fill the illustrated gap. The structure is planarized as illustrated in FIG. 7B using an etching or a chemical-mechanical process such as CMP in the embodiment illustrated in the figure. The planarization process is optional in some embodiments.

A portion of the low-index material is removed using an etching process or other suitable process to provide a partially filled gap as illustrated in FIG. 7C. Then, a second material with an index of refraction higher than the first material is used to fill additional portions of the gap (e.g., to completely fill the gap). In some implementations, multiple additional depositions after the deposition of the first material are utilized to fill the gap. In some embodiments, a deposition is performed that overfills the gap as illustrated in FIG. 7D. In an embodiment, amorphous silicon (i.e., a-Si) is used as the second material. A planarization process is illustrated in FIG. 7D. After formation of the gap filling material, waveguide formation to confine the lateral mode of the waveguides is performed in the illustrated process flow. In alternative embodiments, the lateral waveguide formation can be performed at other stages of the process.

The waveguides illustrated in FIGS. 7A-7F provide optical confinement in the vertical direction using air above the waveguides in some embodiments. In other embodiments, a material with an index lower than the waveguide indices can be utilized, for example, a blanket oxide or nitride as illustrated in FIG. 7F.

Figure 8:
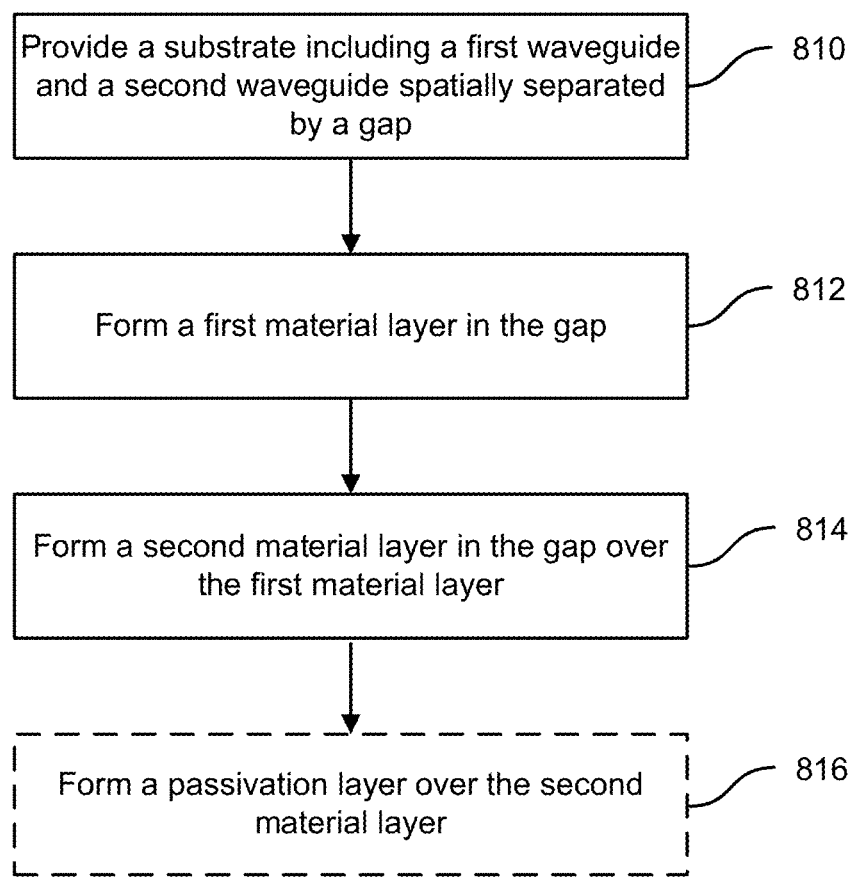
FIG. 8 is a simplified flowchart illustrating a method of fabricating an integrated waveguide coupler according to an embodiment of the present invention.

FIG. 8 is a simplified flowchart illustrating a method of fabricating an integrated waveguide coupler according to an embodiment of the present invention. The method includes providing a substrate including a first waveguide and a second waveguide (810). Both waveguides are operable to guide light along a longitudinal direction and are spatially separated by a gap having a bottom surface. In some implementations, the first waveguide is a silicon-based waveguide integrated into an SOI substrate and the second waveguide is a III-V waveguide fabricated in a III-V material die bonded to (or grown on) the SOI substrate. The first waveguide and the second waveguide can include ridge guide structures or other suitable lateral confinement structures.

The method also includes forming a first material (e.g., a silicon oxide or silicon nitride material) in the gap (812). In some embodiments, the first material is deposited using a blanket deposition, planarized, and etched back to remove the first material at upper portions of the gap, leaving a layer of a predetermined thickness less than the depth of the gap. The first material has a first index of refraction. The first index is less than an effective index of the first waveguide and the second waveguide in some embodiments.

The method further includes forming a second material (e.g., an amorphous silicon material) in the gap (814). Similar to the formation of the first material layer, the formation of the second material layer can include a blanket deposition and optional planarization process followed by an optional etch back process. Masking steps can also be implemented as appropriate to the device geometry. The second material has an index of refraction higher than the first index of refraction. Optionally, a passivation layer can be formed over the second material (818). In order to provide lateral confinement in the gap section, the materials in the gap can be patterned, implanted, or the like to provide optical confinement. In addition to ridge guides and other lateral confinement structures, either or all of the first waveguide, the material in the gap region (i.e., the waveguide coupler), and the second waveguide can be tapered in width as a function of longitudinal dimension.

It should be appreciated that the specific steps illustrated in FIG. 8 provide a particular method of fabricating an integrated waveguide coupler according to an embodiment of the present invention. Other sequences of steps may also be performed according to alternative embodiments. For example, alternative embodiments of the present invention may perform the steps outlined above in a different order. Moreover, the individual steps illustrated in FIG. 8 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating an integrated waveguide coupler, the method comprising:
   at least partially filling a gap with a first material having a first index of refraction, wherein:
   the gap is from 5 to 100 microns wide;
   the gap is between a semiconductor waveguide and an opto-electronic device;
   the semiconductor waveguide is configured to guide light in a direction of beam propagation;
   the opto-electronic device comprises a facet;
   the facet has an orientation identified by a direction normal to the facet;
   the direction normal to the facet is not parallel with the direction of beam propagation; and
   the opto-electronic device is configured to guide light to pass through the facet; and
   at least partially filling the gap with a second material having a second index of refraction that is greater than the first index of refraction, wherein the direction of beam propagation is ascertained at an interface between the semiconductor waveguide and the second material.

2. The method for fabricating the integrated waveguide coupler as recited in claim 1, the method further comprising at least partially filling the gap with a third material, wherein:
   the second material is between the first material and the third material;
   the third material has a third index of refraction; and
   the second index of refraction is greater than the third index of refraction.

3. The method for fabricating the integrated waveguide coupler as recited in claim 2, wherein:
   the first material is silicon dioxide;
   the third material is silicon dioxide; and
   the second material is amorphous silicon.

4. The method for fabricating the integrated waveguide coupler as recited in claim 1, wherein the opto-electronic device comprises III-V material.

5. The method for fabricating the integrated waveguide coupler as recited in claim 1, wherein the opto-electronic device is a gain medium for a laser.

6. An integrated waveguide coupler comprising:
   a silicon substrate;
   a semiconductor waveguide, wherein:
   the semiconductor waveguide is disposed on the silicon substrate;
   the semiconductor waveguide is configured to guide light in a direction of beam propagation; and
   the semiconductor waveguide comprises crystalline silicon;
   a chip, wherein:
   the chip is disposed on the silicon substrate;
   the chip comprises III-V material;
   the chip comprises a facet;
   the chip is configured to guide light to pass through the facet;
   the facet has an orientation identified by a direction normal to the facet; and
   the direction normal to the facet is not parallel with the direction of beam propagation of the semiconductor waveguide; and
   a connecting waveguide between the semiconductor waveguide and the facet of the chip, wherein:
   the connecting waveguide comprises amorphous silicon;
   the direction of beam propagation is ascertained at an interface between the semiconductor waveguide and the connecting waveguide; and
   the connecting waveguide is configured to guide light in the amorphous silicon from the semiconductor waveguide to the chip.

7. The integrated waveguide coupler as recited in claim 6, wherein the connecting waveguide comprises a first material having a first index of refraction and a second material having a second index of refraction higher than the first index of refraction.

8. The integrated waveguide coupler as recited in claim 7, wherein:
   the semiconductor waveguide has a height;
   the connecting waveguide has a height; and
   the height of the connecting waveguide is equal to the height of the semiconductor waveguide.

9. The integrated waveguide coupler as recited in claim 6, wherein: the connecting waveguide has a length from 5 to 100 microns.

10. The integrated waveguide coupler as recited in claim 6, wherein the semiconductor waveguide comprises:
    a ridge for guiding an optical mode; and
    crystalline silicon.

11. The integrated waveguide coupler as recited in claim 6, wherein the connecting waveguide comprises a ridge for guiding an optical mode.

* * * * *